US007339818B2

(12) United States Patent
Katti et al.

(10) Patent No.: US 7,339,818 B2
(45) Date of Patent: Mar. 4, 2008

(54) SPINTRONIC DEVICES WITH INTEGRATED TRANSISTORS

(75) Inventors: Romney R. Katti, Hennepin, MN (US); Theodore Zhu, Mission Viejo, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/146,997

(22) Filed: Jun. 6, 2005

(65) Prior Publication Data

US 2006/0083088 A1 Apr. 20, 2006

Related U.S. Application Data

(60) Provisional application No. 60/577,091, filed on Jun. 4, 2004.

(51) Int. Cl.
*G11C 11/00* (2006.01)

(52) U.S. Cl. ...................... 365/158; 365/171; 365/148; 365/173

(58) Field of Classification Search ................ 365/158, 365/171, 148, 174, 173
See application file for complete search history.

(56) References Cited

U.S. PATENT DOCUMENTS

| | | | |
|---|---|---|---|
| 3,573,485 A | 4/1971 | Ballard | |
| 4,132,904 A | 1/1979 | Harari | |
| 4,470,873 A | 9/1984 | Nakamura | |
| 4,751,677 A | 6/1988 | Daughton et al. | |
| 4,887,236 A | 12/1989 | Schloemann | |
| 5,595,830 A | 1/1997 | Daughton | |
| 5,640,343 A | 6/1997 | Gallagher et al. | |
| 5,650,887 A | 7/1997 | Dovek et al. | |
| 5,650,958 A | 7/1997 | Gallagher et al. | |
| 5,654,566 A | 8/1997 | Johnson | |
| 5,695,864 A | 12/1997 | Slonczewski | |
| 5,701,222 A | 12/1997 | Gill et al. | |
| 5,701,223 A | 12/1997 | Fontana, Jr. et al. | |
| 5,702,831 A * | 12/1997 | Chen et al. | 428/611 |

(Continued)

FOREIGN PATENT DOCUMENTS

EP 0 293 231 A2 11/1988

(Continued)

OTHER PUBLICATIONS

*Magnetoelectronics* [online] [retrieved on Jan. 25, 2002] Retrieved from the Internet: <URL: http://www.ipm.virginia.edu/research/PVD/Pubs/thesis7/chapter2.PDF> Chapter 2, pp. 7-34.

(Continued)

*Primary Examiner*—David Lam
(74) *Attorney, Agent, or Firm*—Knobbe, Martens, Olson & Bear LLP

(57) ABSTRACT

The semiconductor industry seeks to replace traditional volatile memory devices with improved non-volatile memory devices. The increased demand for a significantly advanced, efficient, and non-volatile data retention technique has driven the development of integrated Giant-Magneto-resistive (GMR) structures. The present teachings relates to integrated latch memory and logic devices and, in particular, concerns a spin dependent logic device that may be integrated with conventional semiconductor-based logic devices to construct high-speed non-volatile static random access memory (SRAM) cells.

17 Claims, 4 Drawing Sheets

U.S. PATENT DOCUMENTS

| | | | | |
|---|---|---|---|---|
| 5,861,328 | A | 1/1999 | Tehrani et al. | |
| 5,920,500 | A | 7/1999 | Tehrani et al. | |
| 6,147,922 | A | 11/2000 | Hurst, Jr. et al. | |
| 6,175,525 | B1 | 1/2001 | Fulkerson et al. | |
| 6,269,027 | B1 | 7/2001 | Hurst, Jr. et al. | |
| 6,304,477 | B1 * | 10/2001 | Naji | 365/158 |
| 6,317,359 | B1 | 11/2001 | Black, Jr. et al. | |
| 6,343,032 | B1 | 1/2002 | Black, Jr. et al. | |
| 6,392,924 | B1 | 5/2002 | Liu et al. | |
| 6,438,026 | B2 * | 8/2002 | Gillies et al. | 365/158 |
| 6,493,259 | B1 | 12/2002 | Swanson et al. | |
| 6,515,895 | B2 | 2/2003 | Naji | |
| 6,542,000 | B1 | 4/2003 | Black et al. | |
| 6,693,826 | B1 | 2/2004 | Black, Jr. et al. | |
| 6,714,441 | B1 | 3/2004 | Fulkerson et al. | |
| 6,724,654 | B1 | 4/2004 | Swanson et al. | |
| 6,917,540 | B2 * | 7/2005 | Ooishi | 365/173 |
| 6,927,995 | B2 * | 8/2005 | Nickel et al. | 365/158 |
| 7,038,939 | B2 * | 5/2006 | Amano et al. | 365/158 |
| 2002/0064067 | A1 | 5/2002 | Inui | |

FOREIGN PATENT DOCUMENTS

| | | | |
|---|---|---|---|
| EP | 0 776 011 | A2 | 5/1997 |
| WO | WO 98/20496 | | 5/1998 |

OTHER PUBLICATIONS

Lee, et al., *Separation of Contributions to Spin Valve Interlayer Exchange Coupling Field by Temperature Dependent Coupling Field Measurements*, [online] 46th MMM Conference, Seattle, Washington 2001 pp. 1-16 [retrieved on Jan. 25, 2002] Retrieved from the Internet: <URL: http://www.andrew.cmu.edu/~zlee/mmm.pdf>.

*Non-Volatile Memory* (*MRAM*) *ANXXX*, [online] Honeywell <retrieved on Nov. 19, 2001> <URL: http://www.ssec.honeywell.com/avionics/h_gmr.pdf> pp. 1-4.

Daughton, James M., *Advanced MRAM Concepts*, [online] Article from NVE Corporation, Feb. 7, 2001, pp. 1-6, [retrieved on Jan. 25, 2002] Retrieved from the Internet: <URL: http://www.nve.com/otherbiz/mram.pdf>.

* cited by examiner

SPINTRONIC DEVICES WITH INTEGRATED TRANSISTORS

RELATED APPLICATIONS

This application claims the benefit of U.S. Application No. 60/577,091, filed Jun. 4, 2004, the entirety of which is hereby incorporated by reference.

BACKGROUND OF THE INVENTION

1. Field of the Invention

The present invention relates to semiconductor processing technology and, in particular, concerns a spin dependent logic device that may be used to construct high-speed non-volatile static random access memory (SRAM) cells.

2. Description of the Related Art

Since the introduction of the digital computer, electronic storage devices have been a vital resource for the retention of binary data. Some conventional semiconductor electronic storage devices utilize static latch structures as storage cells, which may be referred to as Static Random Access Memory (SRAM). As is generally known in the art, a conventional SRAM latch circuit utilizes complementary metal-oxide semiconductor (CMOS) circuitry. In one aspect, CMOS SRAM circuitry typically comprises two cross-coupled inverters, wherein the simultaneous activation of two access transistors regulates the flow of current through the cross-coupled inverter circuits for read and write functions. The inverter circuit is a fundamental CMOS circuit utilized in many memory and logic devices, such as SRAM memory, set-reset (SR) flip-flops, and various logic gates. In one aspect, a common CMOS inverter circuit comprises two series connected (drain-to-drain) and matched enhancement type metal-oxide semiconductor field-effect transistor (MOSFET) devices: one n-channel MOSFET and one p-channel MOSFET. Furthermore, the input to the inverter circuit is connected to the gate of each MOSFET device, and the output of the inverter circuit is accessed between the two MOSFET devices at the drain-to-drain connection.

SRAM devices experience fast access times, which makes SRAM a desirable memory storage device. Unfortunately, this type of semiconductor Random Access Memory (RAM) requires a continuous supply of power to maintain or preserve a defined logic-state. As a result, conventional SRAM is considered volatile memory due to the fact that data may be lost with the loss of a continuous supply of power.

Alternatively, Programmable Read Only Memory (PROM) devices, such as Erasable PROM (EPROM) and Electrically Erasable PROM (EEPROM), may be used as non-volatile memory devices in place of SRAM devices. PROM devices are user-modifiable read-only memory (ROM) devices that may be repeatedly erased and reprogrammed. EPROM devices are typically erased by shining an intense ultraviolet light on the circuitry of the memory chip and then reprogrammed in a generally known manner using electrical voltage. Unfortunately, EPROM devices need to be placed in a specially designed device for erasure and programming prior to re-write, which is substantially inconvenient under most circumstances. Unlike EPROM chips, EEPROMs do not need to be placed in a specially designed device for erasure and programming for re-write. Unfortunately, an EEPROM chip typically requires erasure and re-programming in its entirety and in a non-selective manner, which takes a considerable amount of time. In addition, EEPROM devices have limited re-programmability over the life of the device, which, in most cases, re-programmability is limited to tens or hundreds of thousands of times. Other disadvantages to PROM devices include slow read and write times, which may be substantially slower than SRAM devices. Therefore, conventional PROM devices are not typically used as non-volatile random access memory.

Based on the foregoing, there currently exists a need to replace traditional volatile SRAM with an improved solid-state non-volatile memory device that has the speed of conventional SRAM with the logic state preservation of PROM devices. Furthermore, there also exists a need to develop non-volatile memory devices that may be used in conventional applications while still maintaining a high-density fabrication process and technique.

SUMMARY OF THE INVENTION

The aforementioned needs may be satisfied by a memory device comprising, in one embodiment, a semiconductor substrate having a first surface and at least one integrated latch memory component formed on the first surface of the semiconductor substrate, wherein the at least one integrated latch memory component stores a selective logic state having a volatile memory status. In addition, the memory device may further comprise at least one spin dependent logic device formed on the semiconductor substrate, wherein the at least one spin dependent logic device is interconnected to the at least one integrated latch memory component so as to permit a non-volatile application to the selective logic state having a volatile memory status.

In one aspect, the memory device may comprise a static random access memory (SRAM) device. The integrated latch memory component may comprise at least one inverter circuit, wherein the at least one inverter circuit may utilize complementary metal-oxide semiconductor (CMOS) technology. The selective logic state may comprise a binary logic state. The volatile memory status may be defined as an unstable data retention status that is power dependent. The non-volatile memory status may be defined as a stable data retention status that is power independent.

In another aspect, the at least one spin dependent logic device may utilize a selectable resistance differential to store the selective logic state. The at least one spin dependent logic device may comprise a giant magneto-resistance (GMR) device, wherein the GMR device may comprise a device having a first pinned layer of a magnetic material that is magnetized in a first fixed direction and a second layer of magnetic material that may be magnetized in either the first fixed direction or a second direction. In addition, the first pinned layer may comprise a magnetic material selected from the group consisting of NiFeCo, NiFe, CoFe, Cu, Co, Ni, Fe, and Ta. Also, the second layer may comprise a magnetic material selected from the group consisting of NiFeCo, NiFe, CoFe, Cu, Co, Ni, Fe, and Ta.

The aforementioned needs may also be satisfied by an SRAM device formed on a semiconductor substrate. In one embodiment, the SRAM device may comprise a plurality of MOSFET devices formed on a first surface of the semiconductor substrate, wherein the plurality of MOSFET devices are logically interconnected so as to store a logic state with a volatile status. In addition, the memory device may further comprise at least one spin dependent logic device formed on the first surface of the semiconductor substrate, wherein the at least one spin dependent logic device is electrically interconnected to the plurality of MOSFET devices so as to provide a non-volatile operation of the SRAM device, wherein the logic state is stored with a non-volatile logic status.

The aforementioned needs may also be satisfied by a static memory device formed on a semiconductor substrate. In one embodiment, the static memory device may comprise a plurality of solid state components formed on the semiconductor substrate and logically interconnected to temporarily store a logic state having a power dependent storage status. In addition the static memory device may further comprise at least one integrated magneto-resistive component formed on the first surface of the semiconductor substrate and electrically interconnected to the plurality of solid state components, wherein the at least one integrated magnetic component provides a non-volatile storage status to the logic state.

The aforementioned needs may also be satisfied by an integrated memory device comprising, in one embodiment, a volatile memory component logically configured to temporarily store a selective logic state and a non-volatile memory component integrated with the volatile memory component to independently store the selective logic state as a measured resistance differential across the non-volatile memory component in a manner so as to prevent the loss of the selective logic state during a power interrupt.

The aforementioned needs may also be satisfied by a method for preserving a selective logic state with a power dependent status. In one embodiment, the method may comprise logically interconnecting a plurality of MOSFET devices on a first surface of a semiconductor substrate to temporarily store a selective logic state with a power dependent status. In addition, the method may further comprise integrating at least one magneto-resistive device with the plurality of MOSFET devices to independently store the selective logic state in a manner so as to prevent the loss of the selective logic state during a power interruption. These and other objects and advantages of the present teachings will become more fully apparent from the following description taken in conjunction with the accompanying drawings.

BRIEF DESCRIPTION OF THE DRAWINGS

These and other aspects, advantages, and novel features of the invention will become apparent upon reading the following detailed description and upon reference to the accompanying drawings. In the drawings, same elements have the same reference numerals in which.

DETAILED DESCRIPTION OF THE PREFERRED EMBODIMENT

Figure 1A:
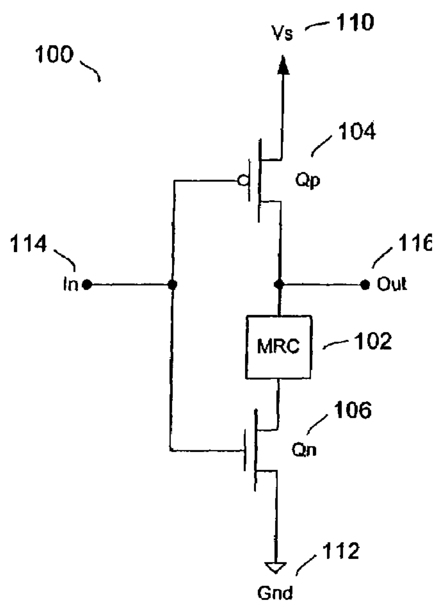
FIG. 1A illustrates one embodiment of an inverter circuit with a magneto-resistive contact (MRC) interposedly coupled in series between two complementary transistors.

Reference will now be made to the drawings wherein like numerals refer to like parts throughout. FIG. 1A illustrates one embodiment of an inverter circuit 100 with a magneto-resistive component or contact (MRC) 102 interposedly coupled in series between two complementary transistors 104, 106. In one aspect, the inverter circuit 100 may be utilized in an SRAM latch structure, such that the inverter circuit 100 utilizes complementary metal-oxide semiconductor (CMOS) technology, wherein a first transistor 104 is a p-channel MOSFET, and a second transistor 106 is an n-channel MOSFET. Solid state semiconductor devices, such as p-channel and n-channel MOSFET devices, may be implemented into circuits that are designed for digital logic and memory functions.

Additionally, the source terminal of the first transistor 104 is connected to a voltage source (Vs) 110, and the drain terminal of the first transistor 104 is connected to the upper terminal of the MRC 102. In addition, the lower terminal of the MRC 102 is connected to the drain terminal of the second transistor 106, and the source terminal of the second transistor 106 is connected to a common ground terminal 112. Moreover, an input terminal 114 of the inverter circuit 100 is connected to the gate terminals of the first and second transistors 104, 106, and an output terminal 116 of the inverter circuit 100 is connected to the drain terminal of the first transistor 104 and the upper terminal of the MRC 102.

In one embodiment, the MRC 102 comprises a Giant-Magneto-Resistive (GMR) stacked structure that may be selectively programmed with the spintronic effect to a state of high resistance or to a state of low resistance. Advantageously, GMR devices employ a developing technology that offers the advantages of improved non-volatility and high-density fabrication. In addition, GMR structures utilize the spin polarization effect of electrons within ferromagnetic material and utilize multi-layers of ferromagnetic materials and a physical property known as magneto-resistance to read the memory storage logic states.

Binary logic states may require the sensing of a resistance differential to distinguish between "on" and "off" states. As is generally known, resistance is a measure of the inability of an electrical current to flow through a specific material, whereas current is the actual flow of electrons through a material. Therefore, if a material has a high resistance, then the ability of electrons to flow through the material may be inhibited. Conversely, a low resistive material tends to allow a higher degree of current to flow. GMR structures take advantage of this variable resistance concept by manipulating the alignments of spin states within multiple layers of magnetic material with proximate magnetic fields to increase or decrease the resistance between the multiple layers.

For example, current flow through a proximate conductive trace induces a magnetic field. In the presence of an orthogonal external magnetic field, the spin direction of stationary GMR electrons may be altered in one of two directions, either "up spin," parallel to the magnetic field, or "down spin," anti-parallel to the magnetic field. Thus, the spin orientation of the affected electrons are either directed "up" or "down" reaffirming the directional spin status of the electron or electrons within the concurrent external magnetic fields.

Moreover, magnetic GMR layers include a pinned (spin stationary) layer and a soft (spin programmable) layer. The selective programmability of the soft layer enables the GMR structure to serve as a logic state device, which stores binary data as directions of net magnetization vectors. In one aspect, current flow through two orthogonal conductive traces polarizes the spin characteristics of the electrons within the soft layer in either a parallel or antiparallel direction. In one aspect, the polarized spin of the soft layer electrons may be altered when influenced by two magnetic fields that are orthogonal to each other.

For example, if the individual magnetic layers are magnetized in the same direction (parallel), the structure exhibits a low electrical resistance. Whereas, if the individual magnetic layers are magnetized in opposite directions (anti-parallel), the structure exhibits a high electrical resistance. The "up" or "down" spin of the electrons are believed to interact with the net magnetization of the layered materials to either facilitate or impede the flow of electrons influenced by an applied electric field. When the layers are magnetically aligned in parallel, either the "up" or "down" electrons may travel through the magnetic material with a reduced electron scattering effect resulting in an overall lower resistance. However, in the case where layers are oppositely magnetized, both "up" and "down" electrons will be scattered by the anti-parallel orientation of the layers and, as a result, a higher percentage of electrons encounter a greater scattering effect corresponding to an overall higher resistance.

In one aspect, the spintronic effect utilizes the net spin-polarization of electrons in a magnetic material, such as Co, Fe, Ni, or any combinational alloy thereof, to produce a variable resistance differential across the material. The binary logic states typically require the sensing of a resistance differential between the upper and lower terminals of the MRC device 102 to distinguish between "on" and "off" states. As previously described, the sensing of a high resistive state may represent the "on" state, and the sensing of a low resistive state may represent an "off" state. Without departing from the scope of the present teachings, it should be appreciated that the converse may be true depending on the specific application of the device. In addition, the non-volatile programming of the GMR stacked structure adds significant advantage to an SRAM memory cell in that the MRC 102 retains the binary state through power-down, reset, and power-up of the SRAM memory cell. The structure and functionality of the MRC 102 will be discussed in greater detail herein below in FIG. 2.

For explanative purposes, a high input at the gate terminal of a MOSFET refers to a voltage that is capable of inducing an n-channel MOSFET into an operational state and reducing a p-channel MOSFET into a non-operational state. Conversely, a low input at the gate terminal of a MOSFET refers to a voltage that is capable of reducing an n-channel MOSFET into a non-operational state and inducing a p-channel MOSFET into an operational state.

In one embodiment, the inverter circuit 100 operates as follows. When a low input appears at the input terminal 114 of the inverter circuit 100, the low input is transferred to the gate terminals of the transistors 104, 106. The low input at the gate terminal of the first transistor 104 induces the p-channel into an operational state and allows current to flow from the source terminal to the drain terminal of the first transistor 104. Conversely, the low input at the gate terminal of the second transistor 104 induces the n-channel into a non-operational state and prevents current flow between the drain terminal and the source terminal of the second transistor 106. Therefore, the potential at the output terminal 116 is substantially similar to the potential at the voltage source 110. Since the output voltage at the output terminal 116 is high, the MRC 102 is programmed to a high resistive state to allow current to source through the first transistor 104 from the voltage source 110 to the output terminal 116. Advantageously, high resistance at the position of the MRC 102 would source the current from the drain terminal of the first transistor 104 to the output terminal 116 of the inverter circuit 100. In a power-down, reset, and power-up sequence, the high resistive state of the MRC 102 would not change due to the non-volatility of GMR stacked structures. Therefore, at power-up, the inverter circuit 100 would sense the high resistive state of the MRC 102 and produce a high output voltage at the output terminal 116 of the inverter circuit 100.

Alternatively, when a high input appears at the input terminal 114 of the inverter circuit 100, the potential at the output terminal 116 is substantially similar to the potential at the ground terminal 112. The high input also appears on the gate terminals of the first and second transistors 104, 106 rendering the first transistor 104 to a non-operational state and the second transistor 106 to an operational state. Since the output voltage at the output terminal 116 is low, the MRC 102 is programmed to a low resistive state to allow current to sink through the second transistor 106 from the output terminal 116 to the ground terminal 112. Advantageously, a low resistance differential across the MRC 102 would sink enough current from the output terminal 116 to provide a low output. In a power-down, reset, and power-up sequence, the low resistive state of the MRC 102 would not change due to the non-volatility of GMR stacked structures. Therefore, at power-up, the inverter circuit 100 would sense the low resistive state of the MRC 102 and produce a low output voltage at the output terminal 116 of the inverter circuit 100.

In one aspect, integrated magneto-resistive devices, such as the MRC 102, may be utilized as direct interconnects, selectable loads, and/or variable resistors, where the direct connection of magneto-resistive components to one or more semiconductor-based transistors is one advantageous feature. Copper (Cu) may be utilized as an interconnect if necessary for increased electron transfers at the point of contact. In addition, integrated magneto-resistive devices may function as current-perpendicular-to-the-plane (CPP) devices or current-in-plane (CIP) devices such that the dimensions of the integrated magneto-resistive devices are electrically configured to accommodate current flow and/or needed resistance differentials across the devices. It should be appreciated that, depending on the application of the MRC, the CCP or CIP configuration may be used by one skilled in the art without departing from the scope of the present teachings.

Additionally, the MRC may be switched by the magnetic field applied by a proximate conductor, or the MRC may be switched by injected current that uses the spin polarization effect that is concerned with the interaction of the spin of electrons and the magnetization. Applications of the device shown in FIGS. 1A-1D include a portion of a latch circuit element, a portion of a memory cell, and a portion of an embedded memory cell. Moreover, the MRC provides a contact between the transistor and one or more device layer(s), while also providing selectable magnetoresistance. The MRC, therefore, provides a contact that is integrated with a magnetic element. The MRC is, therefore, much smaller than a separate magnetoresistive element with a separate contact.

In one aspect, the integrated magneto-resistive devices may also function as memory or logic devices depending on latching, gain, or threshold properties of the device. In one aspect, the magneto-resistive component may be probed optically to access the magneto-resistive state of the device, for example, with the generally known Kerr effect. Moreover, the magneto-resistive component may also be thermographically accessed for writing and reading functions. One embodiment and application includes a non-volatile SRAM device such that the magneto-resistive device maintains the high-speed access times and the high density fabrication of conventional volatile SRAM, but achieves low power consumption with zero cut-off. Furthermore, the structure, composition, and functionality of the integrated magneto-resistive devices will be discussed in greater detail herein below.

Figure 1B:
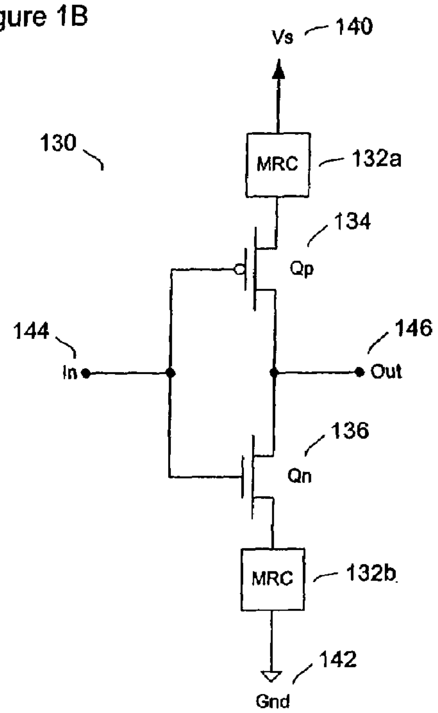
FIG. 1B illustrates another embodiment of an inverter circuit having two magneto-resistive contacts coupled in series with two complementary transistors.

FIG. 1B illustrates another embodiment of an inverter circuit 130 comprising two magneto-resistive contacts (MRC) 132*a*, 132*b* coupled in series with two complementary transistors 134, 136. Similar to the inverter circuit 100 disclosed in FIG. 1A, the inverter circuit 130 utilizes CMOS technology, wherein a first transistor 134 is a p-channel MOSFET, and a second transistor 136 is an n-channel MOSFET. The source terminal of the first transistor 134 is connected to the lower terminal of a first MRC 132*a*, and the drain terminal of the first transistor 134 is connected to the drain terminal of the second transistor 136. The upper terminal of the first MRC 132*a* is connected to a voltage source (Vs) 140. Furthermore, the source terminal of the second transistor 136 is connected to the upper terminal of the second MRC 132*b*, and the lower terminal of the second MRC 132*b* is connected to a common ground terminal 142. Also, an input terminal 144 of the inverter circuit 130 is connected to the gate terminals of the first and second transistors 134, 136, and an output terminal 146 of the inverter circuit 100 is connected to the drain terminals of the first and second transistors 134, 136.

In this embodiment, when a low input appears at the input terminal 144 of the inverter circuit 130, a high output appears at the output terminal 146 of the inverter circuit 130. Therefore, the first MRC 132*a* is programmed to a low resistive state, and the second MRC 132*b* is programmed to a high resistive state. Advantageously, these programmed logic states significantly ensure that, at power-up, the inverter circuit 100 would sense the low resistive state of the first MRC 132*a* and the high resistive state of the second MRC 132*b* and produce a low output voltage at the output terminal 116 of the inverter circuit 100. Conversely, the appearance of a high input at the input terminal 144 would produce a low input at the output terminal 146. As a result, the first MRC 132*a* is programmed to a high resistive state, and the second MRC 132*b* is programmed to a low resistive state. Retaining the binary logic states during a power-down, reset, and power-up sequence is significantly fundamental to the concept of non-volatility such that the inverter circuit 100 would be capable of sensing the most recent binary logic state stored in the integrated magneto-resistive devices, such as MRC devices 144, 146.

Figure 1C:
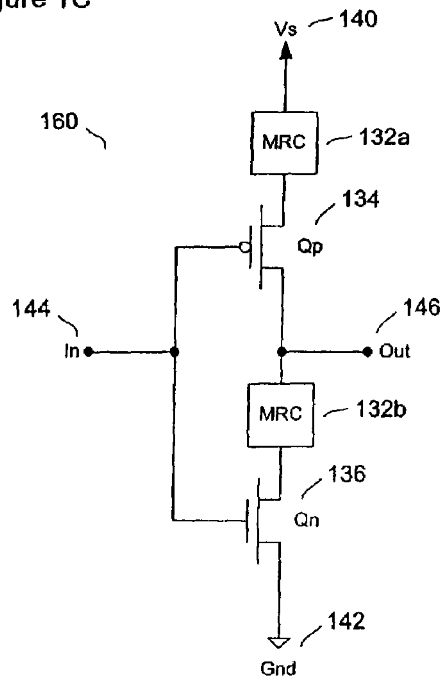
FIG. 1C illustrates still another embodiment of an inverter circuit having two magneto-resistive contacts coupled in series with two complementary transistors.

FIG. 1C illustrates still another embodiment of an inverter circuit 160 comprising two magneto-resistive contacts (MRC) 162*a*, 162*b* coupled in series with two complementary transistors 134, 136. In this embodiment, the configuration of the inverter circuit 160 is similar to the configuration of the inverter circuit 130 in FIG. 1B except that the second MRC 132*b* is positioned above the second transistor 136. The second MRC 166 is positioned within the inverter circuit 160 such that the upper terminal of the MRC is connected to the drain terminal of the first transistor 134, and the lower terminal of the second MRC 132*b* is connected to the drain terminal of the second transistor 136. In addition, the source terminal of the second transistor 136 is connected to the ground terminal 142. Furthermore, the functionality of the inverter circuit 160 is similar in scope to the functionality of the inverter circuit 130 in FIG. 1B.

The embodiments of integrated magneto-resistive devices described herein are transistors integrated with one or more magneto-resistive contacts (MRCs) that provide electrical connectivity (for example, to connect to power, ground, and/or other circuits) and selectable change in resistance. The basic structure of the MRC device, which includes a transistor, such as a silicon-on-insulator or bulk CMOS transistor, and a single MRC is shown in FIGS. 2A-2D. In one aspect, the MRC device may be switched by a magnetic field applied by a proximate conductor, or the MRC device may be switched by injected current that uses the spin polarization effect to manipulate the magnetization of ferromagnetic layers. As previously described, applications of the MRC device include a portion of a latch circuit element, a portion of a memory cell, and a portion of an embedded memory cell, where, in one aspect, the MRC device provides a selectable magneto-resistive contact between a plurality of transistors. Furthermore, an integrated MRC device provides an integrated contact between magnetic-based circuit elements and semiconductor-based circuit elements. As will be described in greater detail herein below, an integrated MRC device is substantially smaller in geometry than a discrete magneto-resistive circuit element with separate conductive contacts. Advantageously, the reduced geometry of the MRC device allows for the utilization of desirable dense fabrication and manufacturing techniques.

Figure 1D:
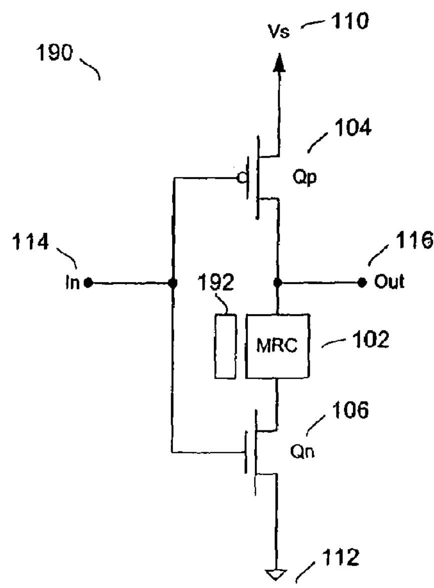
FIG. 1D illustrates yet another embodiment of an inverter circuit with a magneto-resistive contact and a proximate conductor interposedly coupled in series between two complementary transistors.

FIG. 1D illustrates one embodiment of an inverter circuit 190 with a magneto-resistive contact (MRC) 102 and a proximate conductor 192 interposedly coupled in series between two complementary transistors 104, 106. In this embodiment, the configuration of the inverter circuit 190 is similar in scope to the configuration of the inverter circuit 100 in FIG. 1A with the addition of the proximate conductor 192. Advantageously, the proximate conductor 192 may be utilized to switch the net magnetization vector of the MRC 102 from a parallel spin orientation to an anti-parallel spin orientation or vice versa depending on the direction of the current flow through the proximate conductor 192. Additionally, the functionality of the MRC 102 and the process of switching the MRC 102 will be discussed in greater detail herein below. As shown in FIG. 1D, the MRC 102 may subject to one or more induced magnetic fields from the proximate conductor 192 that may be positioned adjacent to the MRC 102. It should be appreciated that one or more proximate conductors 192 may be formed and/or positioned adjacent to one or more MRC 102 devices for the purpose of inducing one or more in-plane magnetic fields and/or perpendicular magnetic fields without departing from the scope of the present teachings.

Figure 2A:
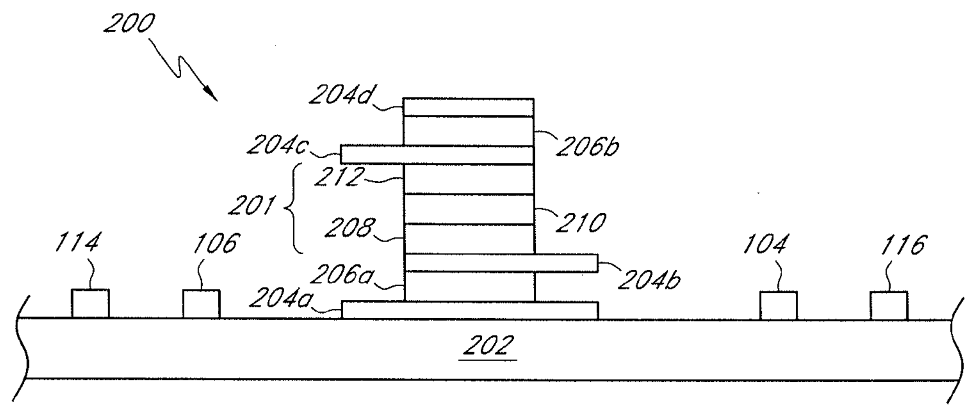
FIG. 2A illustrates a cross-sectional view of one embodiment of a magneto-resistive contact.
Figure 2B:
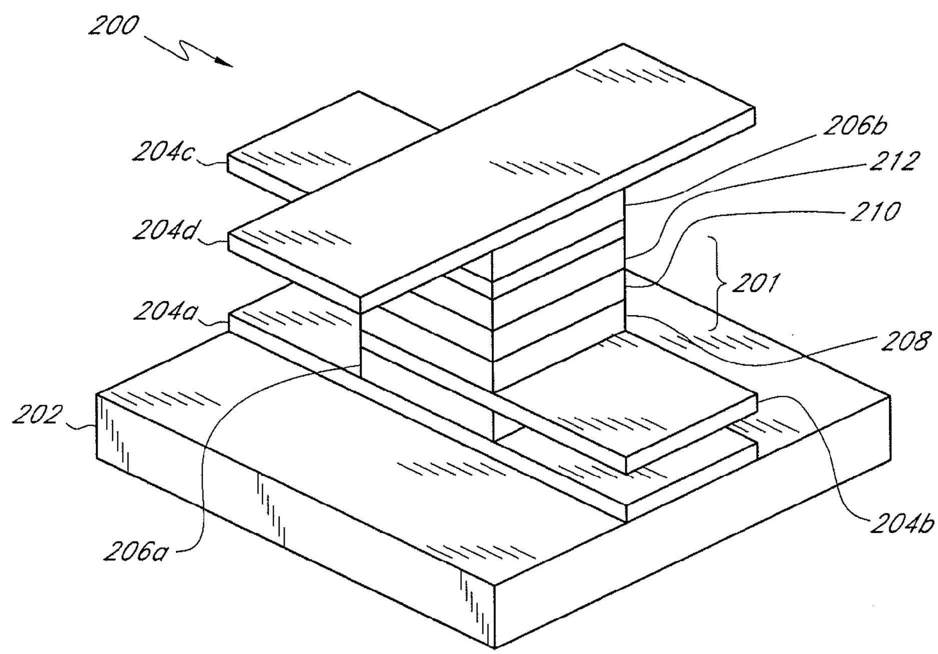
FIG. 2B illustrates a perspective view of the MRC in FIG. 2A.

FIG. 2A illustrates a cross-sectional view of one embodiment of a magneto-resistive contact (MRC) 200. FIG. 2B illustrates a perspective view of the MRC 200 in FIG. 2A, wherein like numerals within FIGS. 2A and 2B correspond to like parts throughout. The MRC 200 is formed on an upper surface of a semiconductor based substrate 202. In one aspect, the semiconductor substrate 202 is manufactured in a manner well known in the art with a substantially flat, smooth, non-rigid upper surface. Semiconductor refers to, but is not limited by, a material such as Silicon, Germanium, or Gallium Arsenide. In addition, the MRC 200 comprises a plurality of conductive traces 204*a*, 204*b*, 204*c*, 204*d*, a plurality of insulation layers 206*a*, 206*b*, and a first GMR stacked structure 201 including a magnetically fixed pinned layer 208, a spacer layer 210, and a magnetically programmable soft layer 212.

In one embodiment, a first conductive trace 204*a* is formed adjacent to the upper surface of the substrate 202. It should be appreciated that the plurality of conductive traces 204*a*, 204*b*, 204*c*, 204*d* are formed of a conductive material, such as aluminum, copper, an aluminum/copper alloy, or doped polysilicon, which is deposited by vacuum evaporation, sputter-deposition, or chemical vapor deposition (CVD) techniques in a manner generally known in the art. In addition, the plurality of conductive traces 204*a*, 204*b*, 204*c*, 204*d* may comprise thin, flat, conductive interconnects. It should also be appreciated that the conductive traces 204*a*, 204*b*, 204*c*, 204*d* can vary dimensionally, including length, width, height, and thickness, depending on the implementation and desirable electrical characteristics without departing from the scope of the present teachings. In one aspect, the first conductive trace 204*a* comprises a first point of reference for programming the net magnetization vector of the magnetically programmable soft layer 212, wherein the first conductive trace 204*a* provides a first magnetic field in a first direction relative to the GMR stacked structure 201.

In one embodiment, a first insulation layer 206*a* is formed adjacent to the upper surface of the first conductive trace 204*a*. It should be appreciated that the plurality of insulation layers 206*a*, 206*b* are formed of a silicon-based material, such as silicon-dioxide ($SiO_2$) or a silicon-nitride ($SiN_x$). Additionally, the insulation layers 206*a*, 206*b* may function as a current flow barrier between conductive traces. In one aspect, a second conductive trace 204*a* may be formed adjacent to the upper surface of the first insulation layer 206*a*. In this embodiment, the second conductive trace 204*b* is positioned substantially parallel to the first conductive trace 204*a*. It should be appreciated that the second conductive trace 204*b* may be oriented in a direction other than parallel without departing from the scope of the present teachings. Also, the second conductive trace 204*b* may function as a lower conductive contact for the GMR stacked structure 201, wherein the GMR structure 201 may be interconnected to other circuit elements in a manner as will be described in greater detail herein below.

In one embodiment, the magnetically fixed pinned layer 208 is formed adjacent to an upper surface of the second conductive trace 204*b*. In various embodiments, the pinned layer 208 may comprise a magnetic-based material, such as a layer of NiFeCo, NiFe, CoFe, Cu, Co, Ni, Fe, or Ta. It should be appreciated that the pinned layer 208 can vary dimensionally, including length, width, height, and thickness, depending on the implementation and desirable electrical characteristics without departing from the scope of the present teachings. GMR stack layers, including the pinned layer 208, are formed in a manner generally known in the art by deposition techniques such as sputter-deposition, physical vapor deposition, or ion-beam deposition. In one aspect, the pinned layer 208 is magnetized in a first fixed direction and functions as a first reference point for the net directional magnetization vectors of the GMR stacked structure 201. The first fixed direction is relative to the collective rotational spin of the electrons within the layered material. Positioning the pinned layer 208 significantly adjacent to the second conductive trace surface 204*b* provides a direct conductive link to the lower portion of the GMR stacked structure 201 as will be described in greater detail herein below.

In one embodiment, the spacer layer 210 is formed on an upper surface of the pinned layer 208. In addition, the spacer layer 210 may comprise a layer of conductive material, such as copper. It should be appreciated that the spacer layer 210 can vary dimensionally, including length, width, height, and thickness, depending on the implementation and desirable electrical characteristics without departing from the scope of the present teachings. In one aspect, the spacer layer 210 is formed using fabrication techniques, such as vacuum evaporation, sputter-deposition, or chemical vapor deposition (CVD) in a manner known in the art. In addition, the spacer layer 210 functions as a conduit for excited electrons to flow through with low traversal resistance.

In another embodiment, the spacer layer 210 comprises a tunneling dielectric layer, wherein the tunneling dielectric layer comprises a layer of $Al_2O_3$ that is approximately 10 to 15 Angstroms thick. It should be appreciated that the spacer layer 210 can vary dimensionally, including length, width, height, and thickness, depending on the implementation and desirable electrical characteristics without departing from the scope of the present teachings. Additionally, various fabrication techniques utilized for producing the tunneling dielectric layer 112 include, first, depositing a conductive aluminum layer in a manner well known in the art. Then, oxidation of the aluminum layer is achieved by one of several different methods: plasma oxidation, oxidation by air, and ion-beam oxidation, wherein all are derived in a manner well known in the art. In this embodiment, the tunneling dielectric layer functions as a conduit for excited electrons to flow through without causing dielectric breakdown at low voltages.

In one embodiment, the magnetically programmable soft layer 212 is formed on an upper surface of the tunneling dielectric layer 112. In various embodiments, the magnetically programmable soft layer 114 comprises a magnetic material, such as a layer of NiFeCo, NiFe, CoFe, Cu, Co, Ni, Fe, or Ta. It should be appreciated that the soft layer 212 can vary dimensionally, including length, width, height, and thickness, depending on the implementation and desirable electrical characteristics without departing from the scope of the present teachings. In one aspect, the magnetically programmable soft layer 212 is magnetized in either a first fixed direction, that is parallel to the magnetization direction of the magnetically fixed pinned layer 208, or a second direction, that is anti-parallel to the to the magnetization direction of the magnetically fixed pinned layer 208. The magnetically programmable soft layer 212 provides a second reference point for the net directional magnetization vectors of the GMR stacked structure 201. It should be appreciated that the GMR stacked structure 201 may comprise multi-layers of NiFeCo, NiFe, CoFe, Cu, Co, Ni, Fe, Ta, or any combination thereof without departing from the scope of the present teachings.

In one embodiment, attached adjacent to the upper surface of soft layer 212 is a third conductive trace 204*c*. In this embodiment, the third conductive trace 204*c* is positioned substantially parallel to the second conductive trace 204*b* so as to prevent switching of the magnetically programmable soft layer 212. The third conductive trace 204*c* functions as an upper conductive contact for the GMR stacked structure 201, wherein the GMR structure 201 may be interconnected to other circuit elements in a manner as will be described in greater detail herein below. In addition, a second insulation layer 206*b* is formed adjacent to the upper surface of the third conductive trace 204*c* in a manner and of a material as previously described with reference to the first insulation layer 206*a*. It should be appreciated that the GMR stacked structure 201 may comprise additional layers as will be described in FIGS. 2C, 2D without departing from the scope of the present teachings.

In one embodiment, a fourth conductive trace 204*d* is formed adjacent to the upper surface of the second insulation layer 206*b*. The fourth conductive trace 204*d* may be positioned substantially perpendicular to the first conductive trace 204*a*. In addition, the fourth conductive trace 204*d* functions as a second reference point for programming the net magnetization vectors of the magnetically programmable soft layer 212. In one aspect, the second conductive trace 204*d* provides a second magnetic field in a second direction that is substantially perpendicular to the first direction of the first magnetic field generated by the first conductive trace 204*a*.

In one embodiment, the MRC 200 in FIG. 2A may be connected to the circuit 100 in a manner as follows. The source terminal of the first transistor 104 remains connected to the voltage source (Vs) 110, and the drain terminal of the first transistor 104 may be connected to the third conductive trace 204*c* of the MRC 200. In addition, the second conductive trace 204*b* may be connected to the drain terminal of the second transistor 106, and the source terminal of the second transistor 106 remains connected to the common ground terminal 112. Moreover, the input terminal 114 of the inverter circuit 100 remains connected to the gate terminals of the first and second transistors 104, 106, and the output terminal 116 of the inverter circuit 100 may be connected to the drain terminal of the first transistor 104 and the third conductive trace 204*c* of the MRC 200. In this embodiment, the first and fourth conductive traces 204*a*, 204*d*, are used to program the net magnetization vectors of the soft layer 212. The second and third conductive traces 204*b*, 204*c* are used to electrically connect the MRC 200 to a circuit 100 in a manner as described. It should be appreciated that the MRC 200 may be similarly integrated into the circuit configurations as described in FIGS. 1B, 1C, 1D.

FIGS. 2A, 2B illustrate one embodiment a functional MRC cell that may be utilized in the various inverter circuit configurations in FIGS. 1A, 1B, 1C, 1D. The operation of the MRC 200 is controlled by magneto-transport, wherein the magneto-resistance depends on the net magnetization vector of the GMR stacked structure 201 or, in other words, the spin orientation of the soft layer 212 with respect to the pinned layer 208 in the GMR stacked structure 201. In one aspect, the spintronic effect utilizes the spin-polarization of electrons to generate a variable resistance differential across the GMR stacked structure 201 such that a parallel spin orientation between the pinned layer 208 and the soft layer 212 results in a relatively low resistance differential across the GMR stacked structure 201, or, conversely, an anti-parallel spin orientation between the pinned layer 208 and the soft layer 212 results in a relatively high resistance differential across the GMR stacked structure 201. In one embodiment, the means for writing to the MRC 200 is by direct polarized spin injection. Alternatively, another means for writing to the MRC 200 is by switching the net magnetization vector in the magnetically programmable soft layer 212 with two orthogonally applied magnetic fields in a manner such that the spin polarization switching may be induced by one or more proximate conductors, such as conductive traces 204*a*, 204*d*.

For example, a first current applied to the first conductive trace 204*a* induces a first magnetic field in a first direction. A second current simultaneously applied to the fourth conductive trace 204*d* induces a second magnetic field in a second direction that is substantially perpendicular to the first direction of the first magnetic field. The simultaneous generation of two orthogonal magnetic fields changes the spin orientation of the net magnetization vector within the soft layer 212 from a parallel spin orientation to an anti-parallel spin orientation. To change from an anti-parallel spin orientation to a parallel spin orientation, he applied currents may be reversed and flow in the opposite direction relative to the initial current flow direction. It should be appreciated that this example is disclosed for illustrative purposes and the directions of applied currents and the induced magnetic fields may be altered without departing from the scope of the present teachings.

Figure 2C:
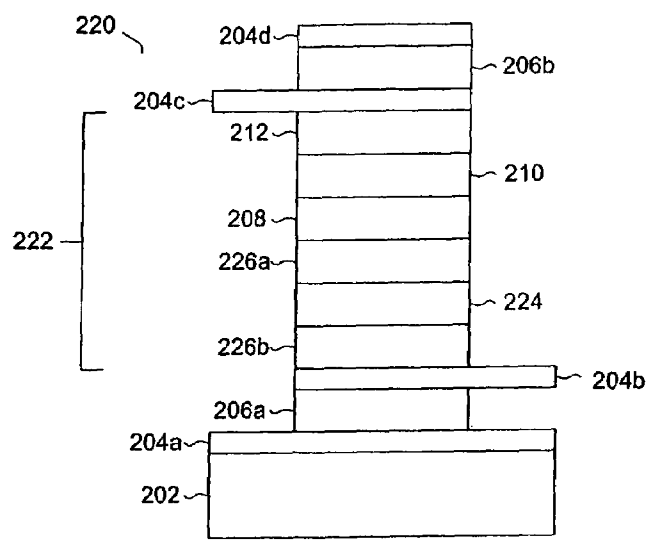
FIG. 2C illustrates a cross-sectional view of another embodiment of a magneto-resistive contact.
Figure 2D:
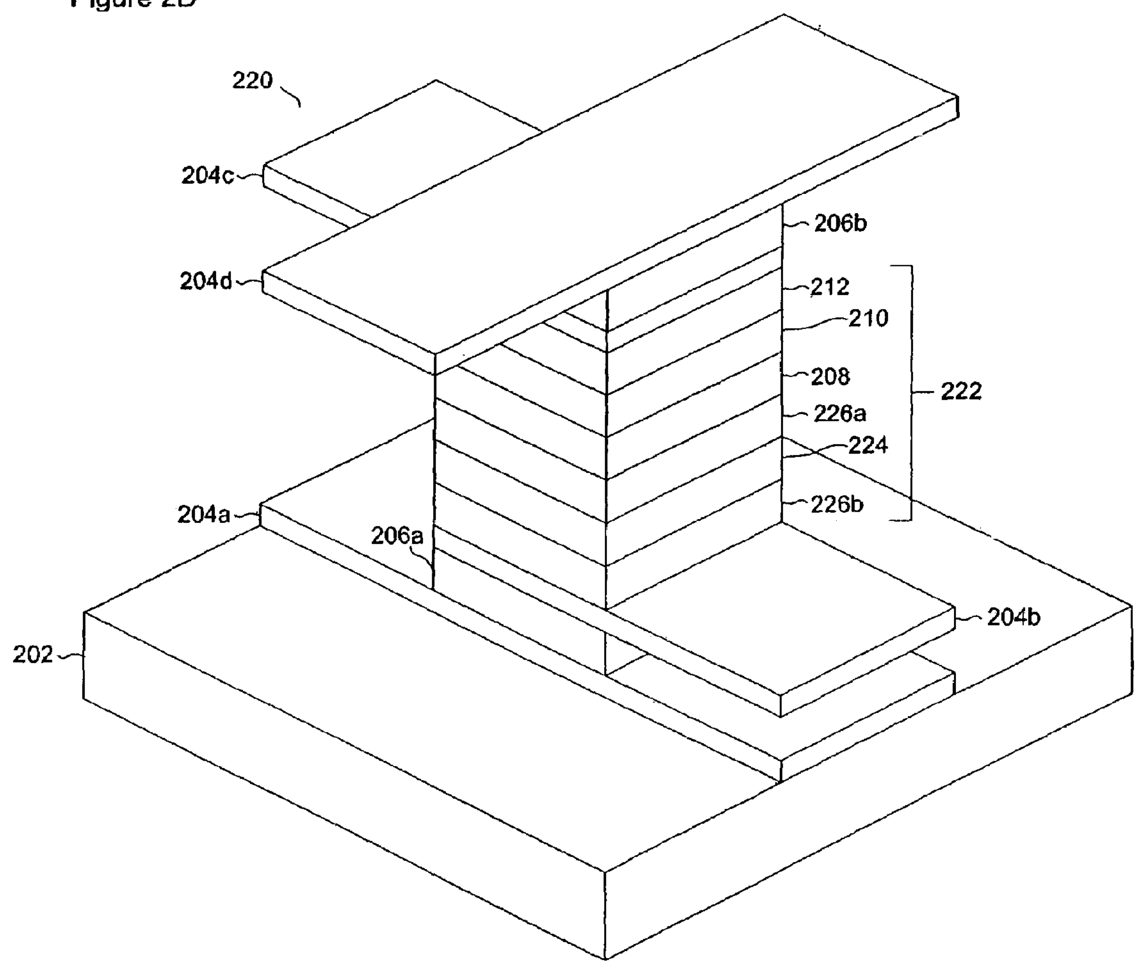
FIG. 2D illustrates a perspective view of the MRC in FIG. 2C.

FIG. 2C illustrates a cross-sectional view of another embodiment of a magneto-resistive contact (MRC) 220. FIG. 2D illustrates a perspective view of the MRC 220 in FIG. 2C, wherein like numerals within FIGS. 2A-2D correspond to like parts throughout. The MRC 220 comprises similar scope and functionality of the MRC 200 in FIGS. 2A, 2B with additional layers 224, 226*a*, 226*b*. The MRC 220 is formed on an upper surface of the semiconductor based substrate 202 in a manner as previously described with reference to the MRC 200 in FIGS. 2A, 2B. In addition, the MRC 200 comprises the plurality of conductive traces 204*a*, 204*b*, 204*c*, 204*d*, the plurality of insulation layers 206*a*, 206*b*, and a second GMR stacked structure 222 including the magnetically fixed pinned layer 208, the spacer layer 210, the magnetically programmable soft layer 212, a third insulation layer 226*a*, a fourth insulation layer 226*b*, and a base layer 224. The additional insulation layers 226*a*, 226*b* may be formed of a similar material and in a similar manner as previously described with reference to the insulation layers 206*a*, 206*b* in FIGS. 2A, 2B. Furthermore, the base layer 224 may comprise Ta or Cu and be formed in manner using generally known deposition techniques.

In this embodiment, the second GMR stacked structure 222 allows reading the magnetization state between the two ferromagnetic layers 208, 212. Writing (switching the top layer as shown) may be accomplished by the spintronic effect (spin injection-directly-transferring spin information in electrons that are injected into the electrons that reside in the magnetization of the ferromagnet). Additionally, switching of the top layer, as shown in FIG. 2C, 2D for example, may be performed or aided by a conductor placed in proximity, such as conductors 204*a*, 204*d*. It should be appreciated that the polarity structure that is used as an input to create spin-polarized electrons may comprise magnetic material, such as Co, Fe, or Ni, or an alloy thereof.

Figure 3:
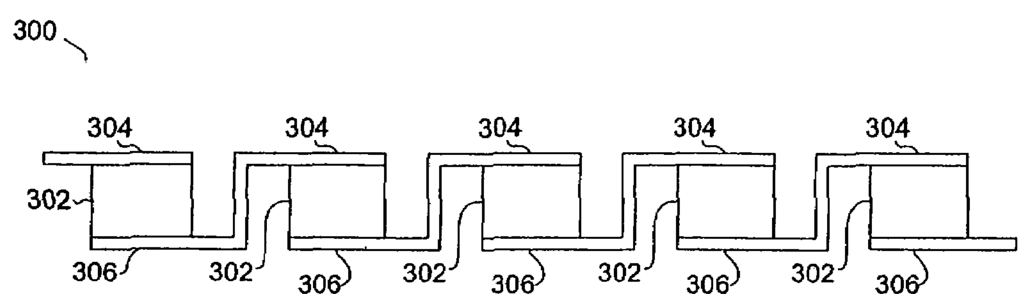
FIG. 3 illustrates one embodiment of an MRC array.

FIG. 3 illustrates one embodiment of an MRC array 300. The MRC array 300 comprises a plurality of MRC devices 302, wherein each MRC device 302 includes and upper electrode 304 and a lower electrode. The upper electrode 304 is formed adjacent to an upper portion of the MRC device 302, and the lower electrode 306 is formed adjacent to a lower portion of the MRC device 302. In one aspect, the plurality of MRC devices 302 are daisy-chained in a manner so as to conductively interlink the lower electrode 306 of one MRC device 302 to the upper electrode of another MRC device 302. The MRC array 300 is a series of one or more conductively interconnected MRC devices 302, which may be utilized to increase the resistance differential between multiple transistors or other circuit elements as needed and if substrate area is available or previously allocated for this purpose. For example, if it is determined that a larger and/or smaller resistance differential is needed in a circuit, such as the inverter circuit 100 in FIG. 1A, then a plurality of MRC devices 302 may be conductively interlinked and positioned between the various circuit elements to increase and/or decrease the resistance differential between the various circuit elements.

Advantageously, integrated GMR-based memory and logic structures, such as the above-mentioned magneto-resistive contacts, provide non-volatility to semiconductor-based memory and logic structures, such as SRAM. In one aspect, the magneto-resistive contact demonstrates integrated latch memory, wherein the source and drain contacts of transistors are electrically interconnected with GMR structures to provide a fully integrated advanced memory cell. Furthermore, another advantage is spin current induced magnetic switching, wherein the point contact CPP structures may be switched by injecting or passing currents from magnetically fixed pinned layers to magnetically programmable soft layers for the purpose of altering the spin polarization of the soft layer relative to the fixed polarized spin of the pinned layer. In one aspect, the proposed switching scheme is significantly selective and highly efficient over conventional switching schemes.

Although the following description exemplifies one embodiment of the present invention, it should be understood that various omissions, substitutions, and changes in the form of the detail of the apparatus, system, and/or method as illustrated as well as the uses thereof, may be made by those skilled in the art, without departing from the spirit of the present invention. Consequently, the scope of the present invention should not be limited to the disclosed embodiments, but should be defined by the appended claims.

What is claimed is:

1. A memory device comprising:

a semiconductor substrate having a first surface;

at least one integrated latch memory component formed on the first surface of the semiconductor substrate, wherein the at least one integrated latch memory component stores a selective logic state having a volatile memory status; and at least one spin dependent logic device formed on the semiconductor substrate, wherein the at least one spin dependent logic device is interconnected to the at least one integrated latch memory component so as to permit a non-volatile application to the selective logic state having a volatile memory status.

2. The device of claim 1, wherein the memory device is a static random access memory (SRAM) device.

3. The device of claim 1, wherein the semiconductor substrate comprises silicon.

4. The device of claim 1, wherein the integrated latch memory component comprises at least one inverter circuit.

5. The device of claim 4, wherein the at least one inverter circuit utilizes complementary metal-oxide semiconductor (CMOS) technology.

6. The device of claim 1, wherein the selective logic state is a binary logic state.

7. The device of claim 1, wherein the volatile memory status is defined as an unstable data retention status that is power dependent.

8. The device of claim 1, wherein the non-volatile memory status is defined as a stable data retention status that is power independent.

9. The device of claim 1, wherein the at least one spin dependent logic device utilizes a selectable resistance differential to store the selective logic state.

10. The device of claim 1, wherein the at least one spin dependent logic device is a giant magneto-resistance (GMR) device.

11. The device of claim 10, wherein the GMR device comprises a device having a first pinned layer of a magnetic material that is magnetized in a first fixed direction and a second layer of magnetic material that is capable of being magnetized in either the first fixed direction or a second direction.

12. The device of claim 11, wherein the first pinned layer is a magnetic material selected from the group consisting of NiFeCo, NiFe, CoFe, Cu, Co, Ni, Fe, and Ta.

13. The device of claim 11, wherein the second layer is a magnetic material selected from the group consisting of NiFeCo, NiFe, CoFe, Cu, Co, Ni, Fe, and Ta.

14. An SRAM device formed on a semiconductor substrate, the SRAM device comprising:

a plurality of MOSFET devices formed on a first surface of the semiconductor substrate, wherein the plurality of MOSFET devices are logically interconnected so as to store a logic state with a volatile status; and at least one spin dependent logic device formed on the first surface of the semiconductor substrate, wherein the at least one spin dependent logic device is electrically interconnected to the plurality of MOSFET devices so as to provide a non-volatile operation of the SRAM device, wherein the logic state is stored with a non-volatile logic status.

15. A static memory device formed on a semiconductor substrate, the static memory device comprising:

a plurality of solid state components formed on the semiconductor substrate and logically interconnected to temporarily store a logic state having a power dependent storage status; and at least one integrated magneto-resistive component formed on the first surface of the semiconductor substrate and electrically interconnected to the plurality of solid state components, wherein the at least one integrated magnetic component provides a non-volatile storage status to the logic state.

16. An integrated memory device comprising:

a volatile memory component logically configured to temporarily store a selective logic state; and a non-volatile memory component integrated with the volatile memory component to independently store the selective logic state as a measured resistance differential across the non-volatile memory component in a manner so as to prevent the loss of the selective logic state during a power interrupt.

17. A method for preserving a selective logic state with a power dependent status, the method comprising:

logically interconnecting a plurality of MOSFET devices on a first surface of a semiconductor substrate to temporarily store a selective logic state with a power dependent status; and integrating at least one magneto-resistive device with the plurality of MOSFET devices to independently store the selective logic state in a manner so as to prevent the loss of the selective logic state during a power interruption.

* * * * *